(12) United States Patent
Timmins et al.

(10) Patent No.: US 12,713,519 B2
(45) Date of Patent: Aug. 18, 2026

(54) DIFFERENTIAL PAIR IMPEDANCE MATCHING FOR A PRINTED CIRCUIT BOARD

(71) Applicant: JABIL INC., St. Petersburg, FL (US)

(72) Inventors: Ian Jeffery Timmins, St. Petersburg, FL (US); Babak Zarrin Rafie, St. Petersburg, FL (US); John Finnell, St. Petersburg, FL (US)

(73) Assignee: JABIL INC., St Petersburg, FL (US)

( * ) Notice: Subject to any disclaimer, the term of this patent is extended or adjusted under 35 U.S.C. 154(b) by 238 days.

(21) Appl. No.: 18/553,631

(22) PCT Filed: Mar. 14, 2022

(86) PCT No.: PCT/US2022/071121
§ 371 (c)(1),
(2) Date: Oct. 2, 2023

(87) PCT Pub. No.: WO2022/213018
PCT Pub. Date: Oct. 6, 2022

(65) Prior Publication Data

US 2024/0188209 A1 Jun. 6, 2024

Related U.S. Application Data

(60) Provisional application No. 63/261,075, filed on Sep. 10, 2021, provisional application No. 63/169,073, filed on Mar. 31, 2021.

(51) Int. Cl.
*H05K 1/02* (2006.01)
*H01P 3/08* (2006.01)
*H05K 3/46* (2006.01)

(52) U.S. Cl.
CPC ............ *H05K 1/0237* (2013.01); *H01P 3/08* (2013.01); *H05K 3/46* (2013.01)

(58) Field of Classification Search
CPC .... H05K 1/0237; H05K 1/0245; H05K 1/025; H01P 3/08; H01P 3/02; H04B 1/0458; H04B 1/18; H01R 12/714; H01R 12/73
(Continued)

(56) References Cited

U.S. PATENT DOCUMENTS 7,192,320 B2 3/2007 Yasumura et al.
9,560,760 B2 1/2017 Wig
(Continued)

FOREIGN PATENT DOCUMENTS

EP 2387295 A1 * 11/2011 ................ H01P 5/10
JP 2020043251 A 3/2020
(Continued)

OTHER PUBLICATIONS

Ren, Fanghui et al.,Effective and Efficient Modeling of Differential Vias Using Semi-Empirical Approach, 2017 IEEE 67th Electronic Components and Technology Conference.

*Primary Examiner* — Timothy J Thompson
*Assistant Examiner* — Sidi M Maiga
(74) *Attorney, Agent, or Firm* — John A. Miller; Shumaker, Loop & Kendrick, LLP

(57) ABSTRACT

A printed circuit board (PCB), such as an antenna backplane, including a first conductor and a second conductor forming a differential pair, a first junction and a second junction connected to the first conductor and the second conductor, respectively, and a first impedance matching stub and a second impedance matching stub connected to the first conductor and the second conductor, respectively. The differential pair has a first impedance, the first junction and the second junction have a second impedance, and the first impedance matching stub and the second impedance matching stub match the second impedance to the first impedance. The PCB may have a connector that has differential pins
(Continued)

joined to the first and second junctions, and the first impedance matching stub and the second impedance matching stub match an impedance of the junctions, pins, and a connector to the first impedance.

15 Claims, 6 Drawing Sheets

(58) Field of Classification Search
USPC .......................................................... 174/250
See application file for complete search history.

(56) References Cited

U.S. PATENT DOCUMENTS

| | | | | |
|---|---|---|---|---|
| 2013/0228366 | A1 | 9/2013 | Lam | |
| 2015/0372366 | A1 | 12/2015 | Frye | |
| 2017/0047686 | A1* | 2/2017 | Wig | H01R 13/6471 |
| 2017/0331250 | A1* | 11/2017 | Kagaya | H05K 1/115 |

FOREIGN PATENT DOCUMENTS

| | | | |
|---|---|---|---|
| WO | 2014005026 | A1 | 1/2014 |
| WO | 2014013339 | A1 | 1/2014 |

* cited by examiner

DIFFERENTIAL PAIR IMPEDANCE MATCHING FOR A PRINTED CIRCUIT BOARD

BACKGROUND

Field

This disclosure relates generally to a printed circuit board (PCB) including a differential pair of conductors and, more particularly, to a PCB including a differential pair of conductors and an impedance matching stub for each conductor.

Discussion of the Related Art

Cellular telecommunications companies began deploying the fifth generation (5G) technology standard for cellular networks in 2019. The 5G standard employs two frequency ranges bands, namely, FR1 (below 7.125 GHZ) and FR2 (24.25 GHz to 52.6 GHZ). Millimeter-Wave (mmWave) 5G FR2 antennas use the high frequencies of FR2 for operation.

Commercialized 5G FR2 products are increasingly driven by cost pressures so the use of existing components and technology is desirable. High pin-count back plane connectors are typically used to provide connectivity between two PCBs for high speed digital applications and, for cost reasons, are preferable over discrete coaxial connectors between PCBs and/or PCB modules. The use of PCB modules may arise where lower cost materials can be used for digital and low frequency RF signals, but more expensive materials might be desirable or necessary for system performance at higher frequency RF signals, such as mmW signals.

Higher frequencies and a higher pin count for a given connector size generally results in higher insertion and reflection losses due to mismatches between the impedance of the microstrip or stripline on a PCB board or module, the impedance of a connector itself, and the impedance of the microstrip or stripline on a connected PCB board or module. One way of avoiding such impedance mismatches is to carefully tailor the width, thickness and spacing of conductors, and the dielectric constant of the PCBs and/or the connector insulation. Such custom tailoring, however, may not be possible, may be prohibitively expensive, and/or may prevent the use of high pin-count back plane connectors.

SUMMARY

The following discussion discloses and describes a PCB, such as an antenna backplane, including at least one differential pair having a first conductor and a second conductor, a first junction and a second junction connected to the first conductor and the second conductor, respectively, and a first impedance matching stub and a second impedance matching stub connected to the first conductor and the second conductor, respectively. The differential pair has a first impedance, the first junction and the second junction have a second impedance, and the first impedance matching stub and the second impedance matching stub match the second impedance to the first impedance. The impedance matching stubs match the impedance of the differential pair of pins of the connector to the impedance of the conductors on the PCB, thereby reducing, among other things, insertion and/or return loss. The PCB may have a connector that also has at least one differential pair of conductors, such as differential pins. The differential pair of conductors of the PCB is connected to the differential pair of pins of the connector.

DETAILED DESCRIPTION

The following discussion of the embodiments of the disclosure directed to a PCB including a differential pair of conductors and an impedance matching stub for each conductor is merely exemplary in nature, and is in no way intended to limit the disclosure or its applications or uses.

Figure 1:
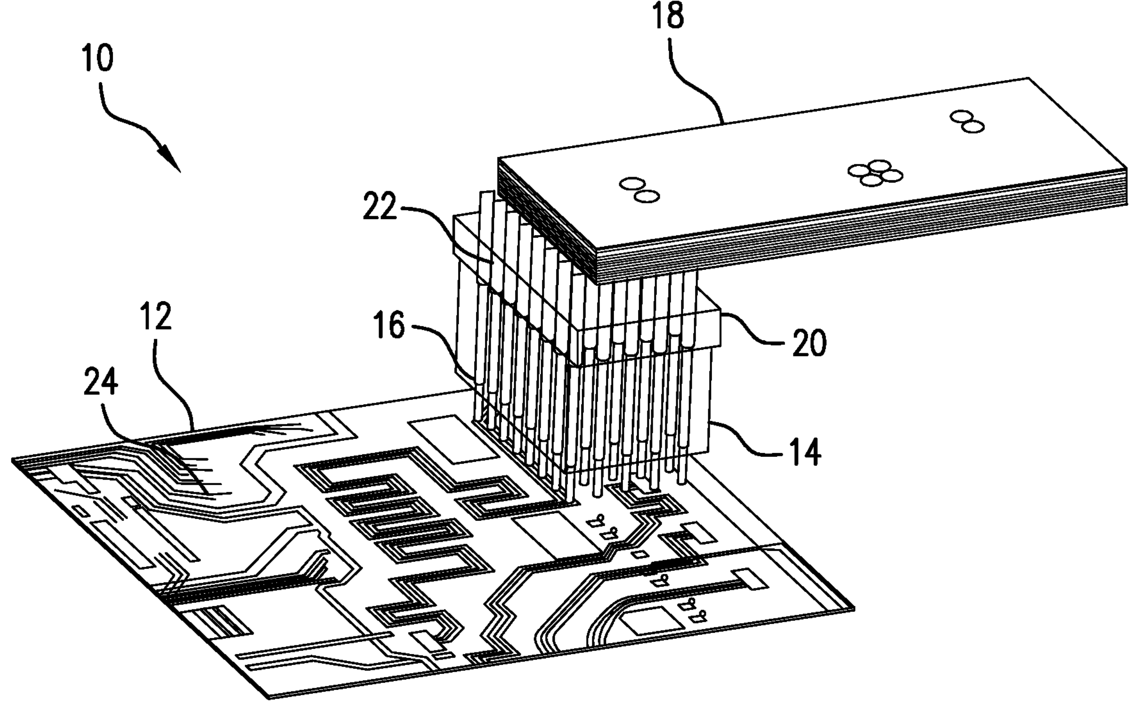
FIG. 1 is an isometric view of a PCB assembly including first and second PCBs.

FIG. 1 is an isometric view of a PCB assembly 10 including a first PCB 12 having a male mating connector 14 with male conducting pins 16 mounted thereto and a second PCB 18 having a female mating connector 20 with female conducting pins 22 mounted thereto, where the connectors 14 and 20 are coupled together. In one non-limiting embodiment, the PCB 12 is an antenna backplane such as, for example, a main module circuit board for a millimeter wave (mmW) phased array antenna and the PCB 18 is a secondary circuit board or expansion board, such as a transmitter and/or receiver board for a millimeter wave (mmW) phased array antenna. The connectors 14 and 20 are short profile, high-pin-count connectors of the type typically used for a network server or switch, which provides cost savings without degrading performance. A number of transmission lines 24 are shown formed to the PCB 12 and may be striplines, microstrips, coplanar waveguides and/or differential pairs. It is noted that a conductive trace on a PCB having a single dielectric layer is often referred to as a microstrip, and a conductive trace surrounded by dielectric material and between two ground planes on internal layers of a PCB having two or more dielectric layers is often referred to as a stripline. For convenience, conductive traces, such as microstrips and striplines, are often referred to herein as "conductors."

Figure 2:
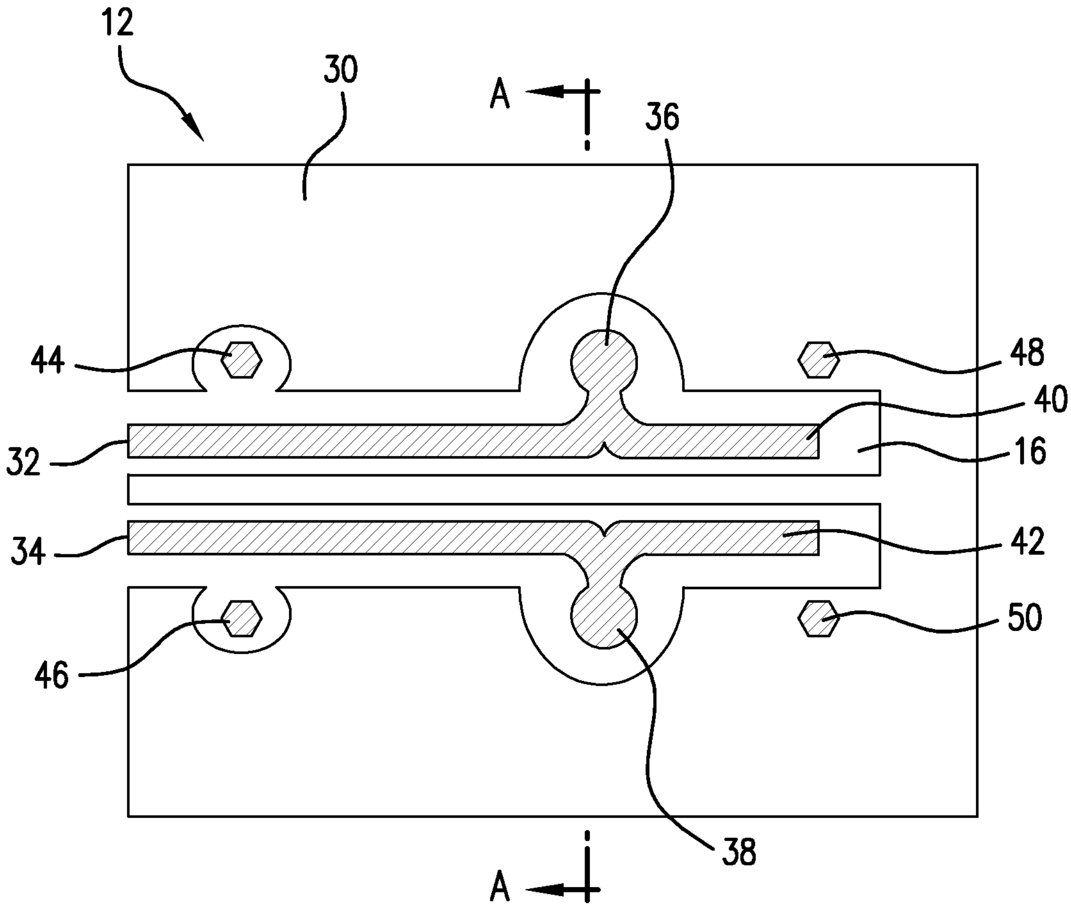
FIG. 2 is an illustration of one of the PCBs in the PCB assembly showing impedance matching tuning stubs of one configuration.

FIG. 2 is a top view of the PCB 12 showing a ground plane 30, a differential pair including conductors 32 and 34, a pair of conductive pads 36 and 38 electrically coupled to the conductors 32 and 34, respectively, a pair of impedance matching tuning stubs 40 and 42 electrically coupled to the conductors 32 and 34, respectively, adjacent to the pads 36 and 38, respectively, where the impedance matching stubs 40 and 42 extend in the same direction as the conductors 32 and 34, and a plurality of connector pins 44, 46, 48 and 50. The PCB 14 would be similar in construction to the PCB 12, where the PCB 14 may also include other specialized circuitry, such as mmW transmitters and/or receivers and/or other mmW circuitry. The conductors 32 and 34 may transport IF signals for a mmWave phased array antenna. Two of the conducting pins 16 would be connected to the pads 36 and 38 when the connector 14 is coupled to the PCB 12. The pads 36 and 38 are connecting junctions with other components (not shown) where the impedance may abruptly change, such as where a conductive trace abruptly and/or significantly changes size, crosses over or under another conductive trace, crosses over or under a component, such as a surface mount component, and/or is in the vicinity of a component large enough and/or near enough to substantially affect the impedance.

The conductors 32 and 34 have a characteristic impedance Z0 in the region shown by line A-A. The pads 36 and 38, however, have a different size and shape than the conductors 32 and 34, and therefore have a different characteristic impedance Z1. As a result, there may be a mismatch between the impedance of the conductors 32 and 34 and the impedance of the pads 36 and 38. Such an impedance mismatch can result in insertion loss, reflection loss, data loss, data corruption, and/or, in higher transmitted power cases, damage to components connected to the conductors 32 and 34, or to the PCB 12 itself, due to excessive reflected voltage on the conductors 32 and 34. In order to reduce or eliminate the impedance mismatch, the impedance matching stubs 40 and 42 are connected to the conductors 32 and 34. The physical characteristics of the impedance matching stubs 40 and 42 are selected so that impedance Z2 and impedance Z1 combine to match impedance Z0 of the conductors 32 and 34. Thus, the conductors 32 and 34 are terminated in impedance Z0, which improves the insertion loss and return loss over the band of interest. Although the impedance matching stubs 40 and 42 are shown as being on the same side of the PCB 12 as the conductors 32 and 34, they may also be on the opposite of the PCB 12 and connected to the conductors 32 and 34 by a via (not shown).

Various characteristics of the impedance matching stubs 40 and 42 can be altered to provide the desired impedance, including the length, the width, the thickness and/or the shape of the impedance matching stubs 40 and 42. Other impedance changing characteristics include the presence or absence of a ground plane under the matching stubs 40 and 42, the distance from the matching stubs 40 and 42 to the adjacent ground plane 30, the position of the matching stubs 40 and 42 on the conductors 32 and 34, i.e., how close they are to the pads 36 and 38, whether the distal end of the impedance matching stubs 40 and 42 is open or grounded, and whether the impedance matching stubs 40 and 42 are separate or are coupled to each other. The distal end of the impedance matching stubs 40 and 42 may be grounded if a DC component is not present.

Preferably, for each of the conductors 32 and 34 that pass through the connectors 14 and 20, there is a pair of impedance matching stubs on the PCB 12, and another pair of impedance matching stubs on the PCB 14. This quad impedance matching stub configuration improves the impedance matching in the PCB/connector/PCB configuration over the impedance matching as compared to where only one PCB has impedance matching stubs. This quad stub configuration also increases the bandwidth of the impedance matching as compared to where only one PCB has impedance matching stubs. The increased bandwidth of the quad stub configuration can be also used to compensate for variance in dielectric properties of lower cost materials, such as lower cost PCBs and/or lower cost connectors, thus providing a more cost effective design capability. Thus, impedance matching is preserved along the conductors 32 and 34 on the PCB 12, through the mating connectors 14 and 20, and along a corresponding differential pair on the PCB 18.

The impedance matching stubs 40 and 42 are useful in multiple-PCB wireless products, such as 5G phased arrays where a low cost PCB is used for the power and/or low frequency functions and components, and a different more costly PCB is used for high frequency functions and components, such as the IF signal band components and the mmWave components. The impedance matching stubs 40 and 42 are also useful in high speed digital systems, such as servers and networking systems that use high pin count connectors.

In other embodiments, one or both of the impedance matching stubs 40 and 42 can be curved, rather than straight. Further, one or both of the impedance matching stubs 40 and 42 can have a tapered width, rather than being of a constant width, where the taper is increasing or decreasing. Also, one or both of the impedance matching stubs 40 and 42 can have a tapered thickness, rather than being of a constant thickness, where the taper may be increasing or decreasing. Furthermore, the impedance matching stub 40 may have a different physical configuration than the impedance matching stub 42 so as to provide a different impedance and/or to compensate for differences in the PCB 12, such as placement of other components on the PCB 12. The impedance matching stub 40 may have an impedance that is different than the impedance of the impedance matching stub 42.

Figure 3:
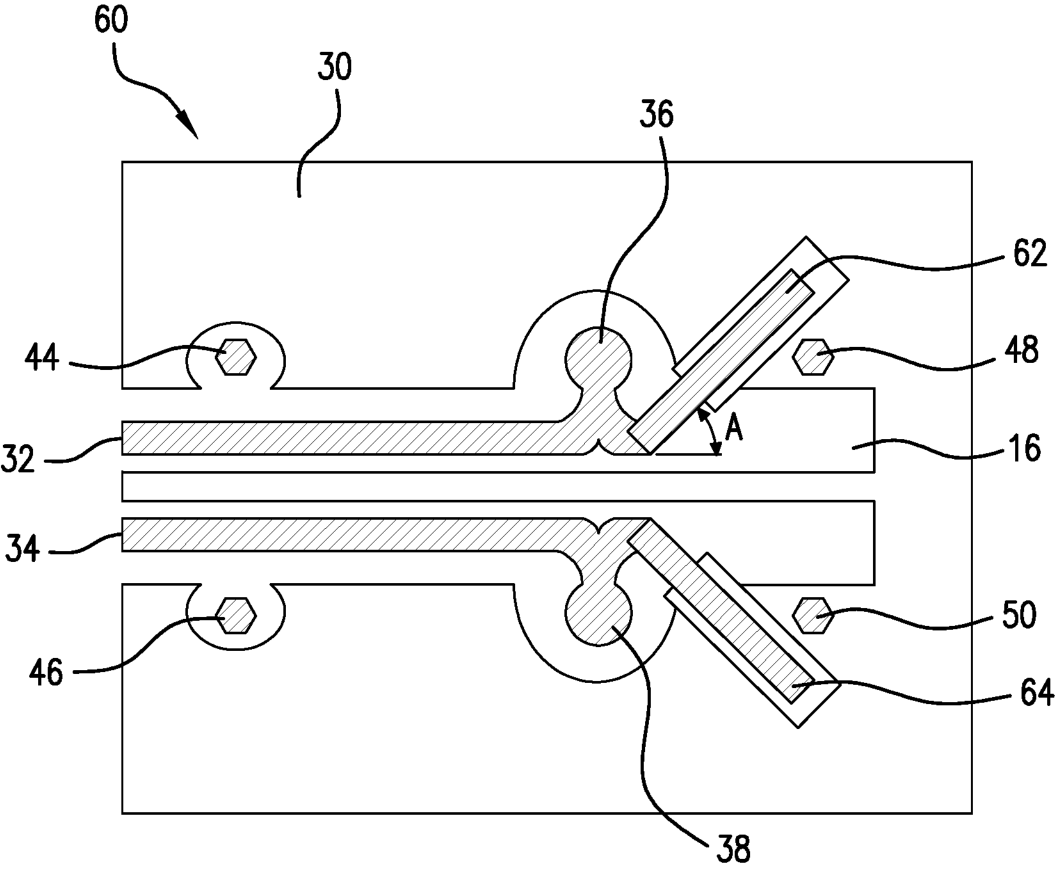
FIG. 3 is an illustration of one of the PCBs in the PCB assembly showing impedance matching tuning stubs of another configuration.

FIG. 3 is a top view of a PCB 60 that is similar to the PCB 12, where like elements are identified by the same reference number. In the PCB 60, the impedance matching stubs 40 and 42 are replaced with impedance matching tuning stubs 62 and 64 that extend at an angle A with respect to the conductors 32 and 34, where the angle A can be any desired angle between 0 degrees and 90 degrees. The greater the angle A, the less the coupling between the impedance matching stubs 42 and 44.

Figure 4:
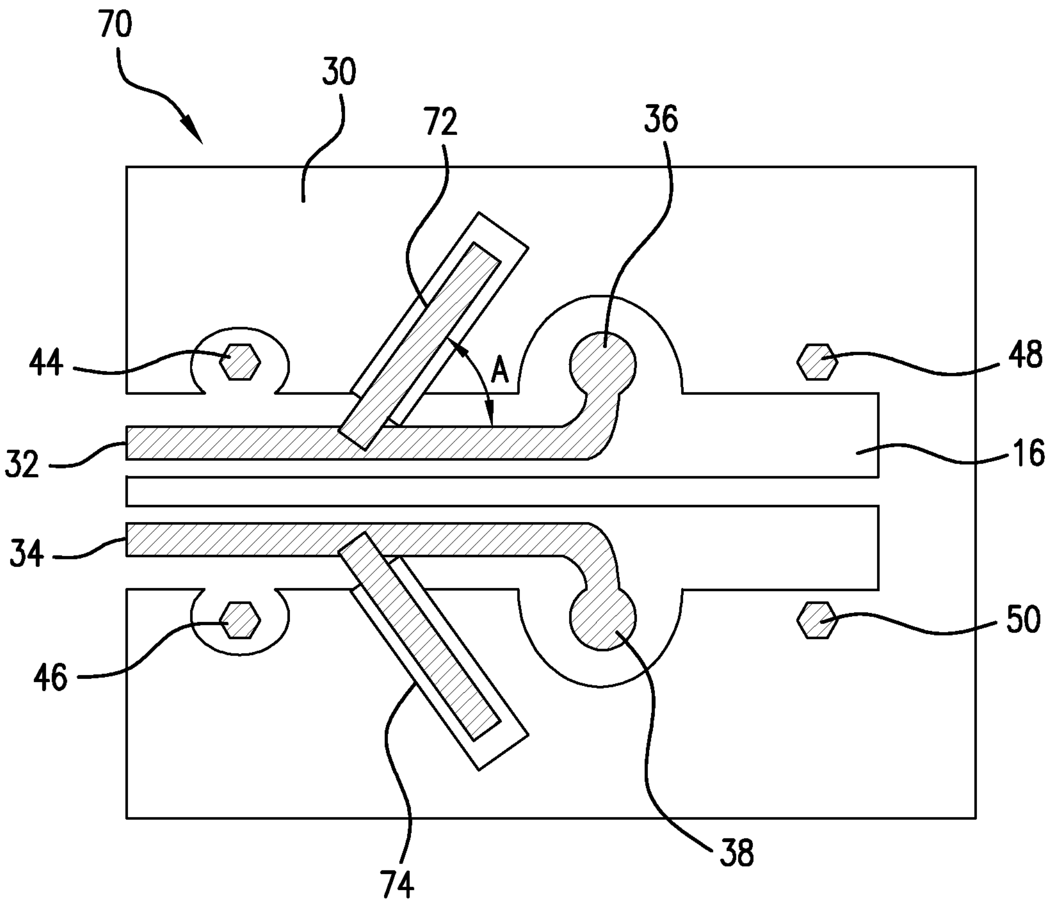
FIG. 4 is an illustration of one of the PCBs in the PCB assembly showing impedance matching tuning stubs of yet another configuration.

FIG. 4 is a top view of a PCB 70 that is similar to the PCB 12, where like elements are identified by the same reference number. In the PCB 70, the impedance matching stubs 40 and 42 are replace with impedance matching tuning stubs 72 and 74 that coupled to the conductors 32 and 34 on an opposite side of the pads 36 and 38 and extend at an angle A with respect to the conductors 32 and 34, where the angle A can be any desired angle between 0 degrees and 180 degrees depending on the placement of other components on the PCB 70.

Figure 5:
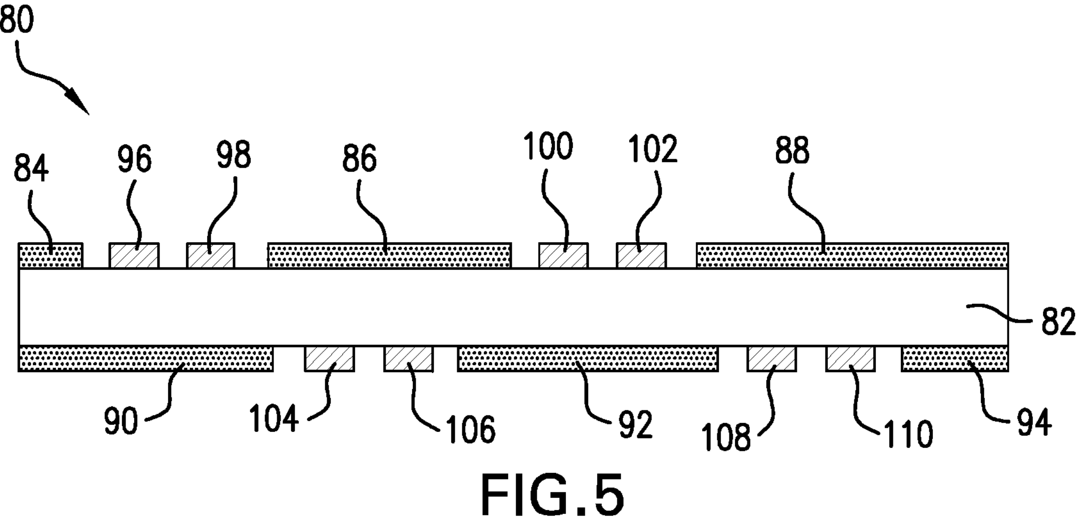
FIG. 5 is a side profile view of a double-sided PCB.

FIG. 5 is a side profile view of a double-sided PCB 80 that is similar to the PCB 12. The PCB 80 includes a substrate 82, spaced apart ground planes 84, 86 and 88 formed on a top side of the substrate 82, spaced apart ground planes 90, 92 and 94 formed on a bottom side of the substrate 82, a pair of impedance matching tuning stubs 96 and 98 formed on the top side of the substrate 82 between the ground planes 84 and 86, a pair of impedance matching tuning stubs 100 and 102 formed on the top side of the substrate 82 between the ground planes 86 and 88, a pair of impedance matching tuning stubs 104 and 106 formed on the bottom side of the substrate 82 between the ground planes 90 and 92, and a pair of impedance matching tuning stubs 108 and 110 formed on the bottom side of the substrate 82 between the ground planes 92 and 94. In order to avoid signal coupling, all of the impedance matching stubs 96, 98, 100, 102, 104, 106, 108 and 110 do not lie directly across the substrate 86 from any of the other impedance matching stubs 96, 98, 100, 102, 104, 106, 108 and 110, but lie directly across the substrate 82 from one of the ground planes 84, 86, 88, 90, 92 or 94, as shown.

Figure 6:
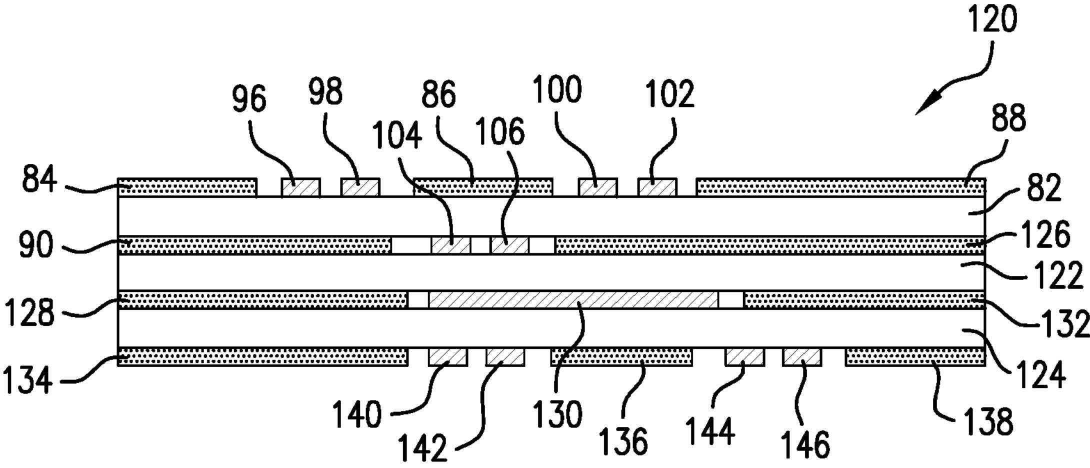
FIG. 6 is a side profile view of a multi-layer PCB.

FIG. 6 is a side profile view of a multi-layer PCB 120 that is similar to the PCB 80, where like elements are identified by the same reference number. In addition to the substrate 82, the PCB 120 includes a middle substrate 122 and a bottom substrate 124, as shown. The impedance matching stubs 108 and 110 and the ground planes 92 and 94 are eliminated and replaced with a ground plane 126. Further, space apart ground planes 128, 130 and 132 are formed between the substrates 122 and 124, space apart ground planes 134, 136 and 138 are formed to a bottom side of the substrate 124, a pair of impedance matching tuning stubs 140 and 142 are formed on the bottom side of the substrate 124 between the ground planes 134 and 136 and a pair of impedance matching tuning stubs 144 and 146 are formed on the bottom side of the substrate 124 between the ground planes 136 and 138.

Figure 7:
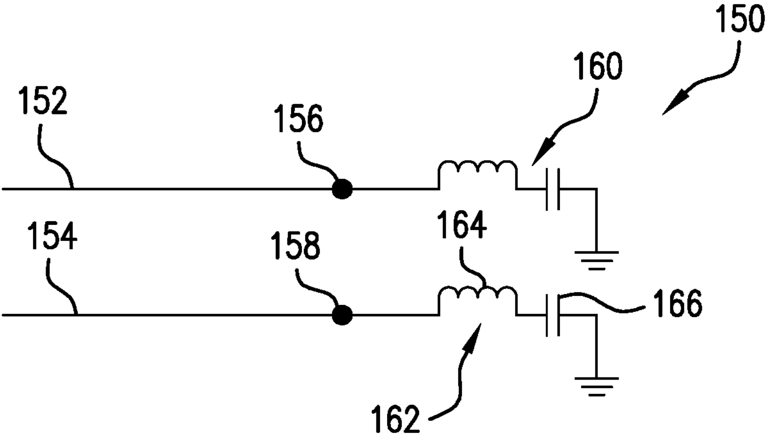
FIG. 7 is a schematic diagram showing a differential pair, pads and an electrical representation of the impedance matching stubs.

FIG. 7 is a schematic diagram of an equivalent circuit 150 including conductors 152 and 154 representing, for example, the conductors 32 and 34 and pads 156 and 158 representing, for example, the pads 36 and 38. The impedance matching stubs 40 and 42 are represented as series resonant circuits 160 and 162 each including an inductor 164 and a capacitor 166.

Figure 8:
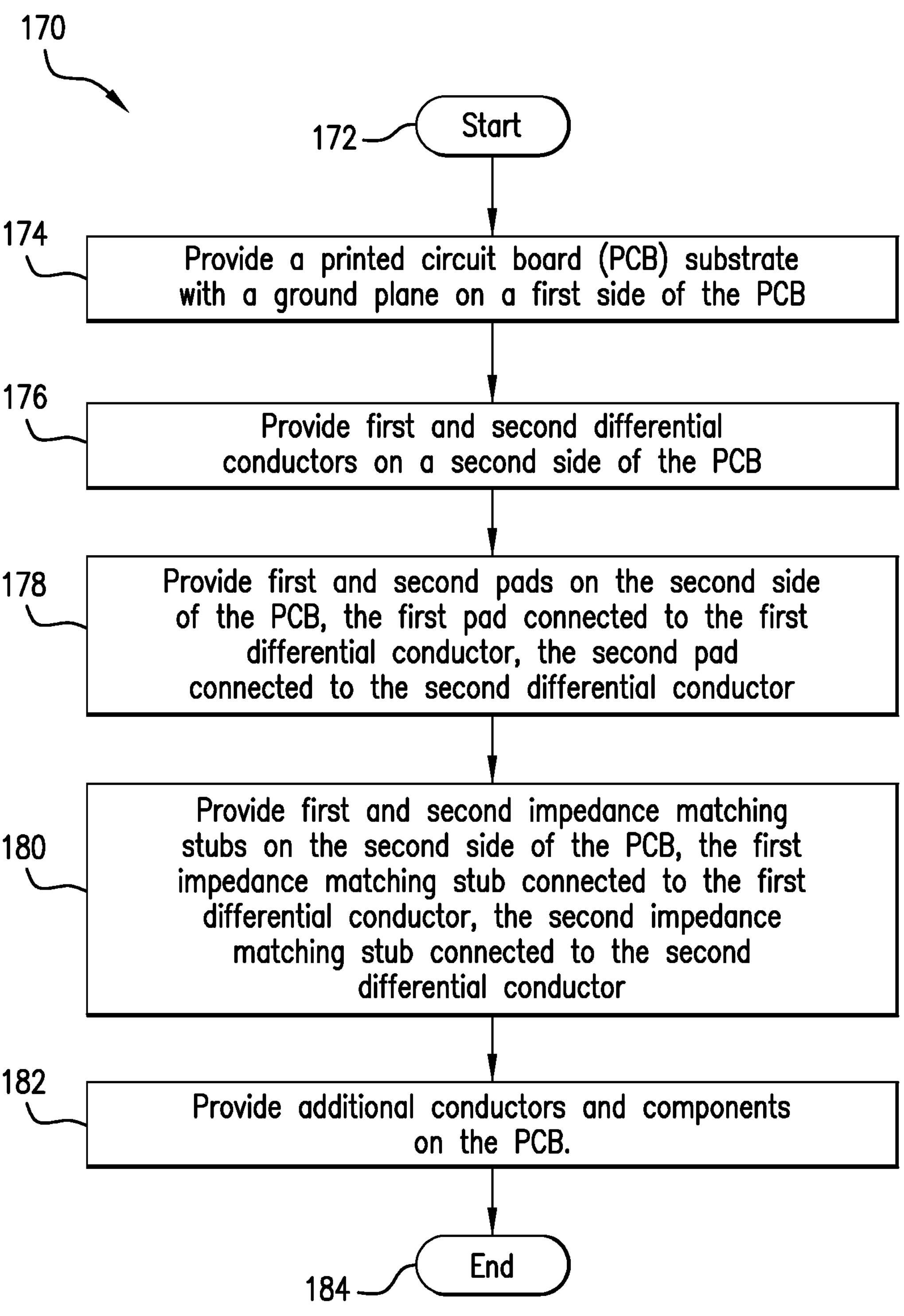
FIG. 8 is a flowchart of a method for manufacturing a PCB with impedance matching tuning stubs.

FIG. 8 is a flowchart diagram 170 showing a process for manufacturing a PCB, such as the PCB 12. After starting at box 172, the process provides a PCB substrate with a ground plane on a first side of the PCB at box 174. At box 176, first and second differential conductors are provides on a second side of the PCB. At box 178, first and second pads are provided on the second side of the PCB, where the first pad is connected to the first differential conductor and the second pad is connected to the second differential conductor. At box 180, first and second impedance matching stubs are provided on the second side of the PCB, where the first impedance matching stub is connected to the first differential conductor and the second impedance matching stub is connected to the second differential conductor. At box 182, additional conductors and components are provided on the PCB, which may be a ground plane on the second side of the PCB, one or more non-paired conductors, one or more pairs of differential conductors, one or more non-paired pads, one or more pairs of pads, electrical components, mechanical components, connectors with pins, etc. The process ends at box 184.

The steps of providing the first and second differential conductors, first and second pads, first and second impedance matching stubs, and additional conductors are shown separately for convenience in viewing and reading. It should be appreciated that, in conventional manufacturing of PCBs, these steps would, in effect, all be performed simultaneously in the etching process. Various components would then be soldered or otherwise fastened in place on the PCB.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A printed circuit board (PCB) comprising:
- a differential pair including a first conductor and a second conductor;
- a first junction and a second junction connected to the first conductor and the second conductor, respectively;
- a first impedance matching tuning stub and a second impedance matching tuning stub connected to the first junction and to the second junction, respectively, wherein the first impedance matching tuning stub includes dual impedance matching tuning stubs; and
- a connector including first and second differential pins, wherein the first and second differential pins are electrically coupled to the first and second junctions, respectively.

2. The PCB of claim 1, wherein the differential pair has a first impedance, the first junction and the second junction have a second impedance, and the first impedance matching stub and the second impedance matching stub match the second impedance to the first impedance.

3. The PCB of claim 1, wherein the differential pair has a first impedance, the first junction and the second junction have a second impedance, the first impedance matching stub has a first length and a first shape, the second impedance matching stub has the first length and the first shape, and at least one of the first length or the first shape being such that the first impedance matching stub and the second impedance matching stub match the second impedance to the first impedance.

4. The PCB of claim 1, wherein the differential pair has a first impedance, the first junction and the second junction have a second impedance, the first impedance matching stub has a first length and a first shape, the second impedance matching stub has second length and a second shape, and at least one of the first length, the first shape, the second length, or the second shape match the second impedance to the first impedance.

5. The PCB of claim 1, wherein at least one of the first impedance matching stub or the second impedance matching stub is either a stripline or a microstrip.

6. The PCB of claim 1, wherein the PCB has a first side and a second side separated by a non-conductive substrate, the first side having a ground plane, and the differential pair of conductors, the first impedance matching stub, the second impedance matching stub, the first junction, and the second junction, are on the second side.

7. The PCB of claim 1, wherein the PCB is a multilayer printed circuit board, and the first impedance matching stub and the second impedance matching stub are on an internal layer of the PCB.

8. The PCB of claim 1, wherein the second impedance matching tuning stub includes dual impedance matching tuning stubs.

9. A printed circuit board (PCB) comprising:
- a differential pair of conductors, the differential pair having a first conductor and a second conductor;
- a first pad and a second pad connected to the first conductor and the second conductor, respectively;
- a first impedance matching stub and a second impedance matching stub connected to the first pad and the second pad, respectively, wherein the first impedance matching tuning stub includes dual impedance matching tuning stubs; and
- a connector mounted on the PCB, the connector having a differential pair of pins, the differential pair of pins being connected to the first pad and the second pad, wherein the differential pair has a first impedance, the first and second pad, the connector, and the differential pair of pins present a second impedance, and the first impedance matching stub and the second impedance matching stub match the second impedance to the first impedance.

10. The PCB of claim 9, wherein the distal end of the first impedance matching stub and the distal end of the second impedance matching stub are open-circuited.

11. The PCB of claim 9, wherein the first impedance matching stub has a first length, the second impedance matching stub has the first length, and the first length being such that the first impedance matching stub and the second impedance matching stub match the second impedance to the first impedance.

12. The PCB of claim 9, wherein the first impedance matching stub has a first length, the second impedance matching stub has a second, different length, and the first length and the second length being such that the first impedance matching stub and the second impedance matching stub match the second impedance to the first impedance.

13. The PCB of claim 9, wherein the first impedance matching stub has a first shape, the second impedance matching stub has the first shape, and the first shape being such that the first impedance matching stub and the second impedance matching stub match the second impedance to the first impedance.

14. The PCB of claim 9, wherein the first impedance matching stub has a first shape, the second impedance matching stub has a second, different shape, and the first shape and the second shape are such that the first impedance matching stub and the second impedance matching stub match the second impedance to the first impedance.

15. The PCB of claim 9, wherein the second impedance matching tuning stub includes dual impedance matching tuning stubs.

* * * * *